(12) United States Patent
Minzoni et al.

(10) Patent No.: US 9,361,180 B2
(45) Date of Patent: Jun. 7, 2016

(54) STORING DATA BY AN ECC MEMORY

(71) Applicant: XI'AN UNIIC SEMICONDUCTORS CO., LTD., Xi'an (CN)

(72) Inventors: Alessandro Minzoni, Xi'an (CN); Ni Fu, Xi'an (CN)

(73) Assignee: XI'AN UNIIC SEMICONDUCTORS CO., LTD., Xi'an (CN)

( * ) Notice: Subject to any disclaimer, the term of this patent is extended or adjusted under 35 U.S.C. 154(b) by 0 days.

(21) Appl. No.: 14/528,797

(22) Filed: Oct. 30, 2014

(65) Prior Publication Data

US 2015/0121170 A1    Apr. 30, 2015

(30) Foreign Application Priority Data

Oct. 31, 2013  (CN) .......................... 2013 1 0536363

(51) Int. Cl.
*H03M 13/00*  (2006.01)
*G06F 11/10*  (2006.01)
*H03M 13/03*  (2006.01)

(52) U.S. Cl.
CPC .......... *G06F 11/1048* (2013.01); *G06F 11/108* (2013.01); *G06F 11/1072* (2013.01); *H03M 13/03* (2013.01)

(58) Field of Classification Search
CPC .............. G06F 11/108; G06F 11/1048; G06F 11/1072; H03M 13/03
See application file for complete search history.

(56) References Cited

U.S. PATENT DOCUMENTS

| 8,627,183  | B1 * | 1/2014 | Chen    | ............... | H03M 13/2909 |
|            |      |        |         |                 | 714/758      |
| 8,694,862  | B2 * | 4/2014 | Sazeides| ............. | G06F 11/1008 |
|            |      |        |         |                 | 714/703      |
| 2015/0067438 | A1 * | 3/2015 | Suzuki | ............... | G06F 11/1068 |
|            |      |        |         |                 | 714/758      |

* cited by examiner

*Primary Examiner* — Shelly A Chase
(74) *Attorney, Agent, or Firm* — Fish & Richardson P.C.

(57) ABSTRACT

Methods, systems and apparatus for storing data by an ECC memory are provided. In one aspect, when an ECC memory configured to be used for data blocks with a first data length is used for data blocks with a reduced second data length, a method includes storing at least one data block with the second data length in a data bit storage part of a storage array and storing parity bits generated for only one data block of the at least one data block according to a relevant encoding rule in a parity bit storage part of the storage array. When the at least one data block is two or more data blocks, one or more judgment bits, which indicate that the stored parity bits correspond to the only one data block, are stored in one or more storage bits of the parity bit storage part that are not occupied.

23 Claims, 2 Drawing Sheets

STORING DATA BY AN ECC MEMORY

CROSS-REFERENCE TO RELATED APPLICATION

This application claims priority under 35 U.S.C. §119 to Chinese Patent Application No. CN 201310536363.2, filed on Oct. 31, 2013. The contents of this priority application are hereby incorporated by reference in their entirety.

TECHNICAL FIELD

The present invention relates to methods, systems and apparatus for storing data by an Error Correction Code (ECC) memory, particularly for enabling an ECC memory to be used for storing data blocks with different data lengths in a relatively efficient manner.

BACKGROUND

When data are accessed, accessing is usually performed on the basis of data blocks with a certain length, i.e., when the data are written into a memory, the data are divided into a plurality of data blocks with the same data length, and each of the data blocks is stored, as a whole, in the memory; and, when the data are read from the memory, each of the data blocks is read as a whole. The length of such a data block which is accessed as a whole can be referred to as "data length".

In the course of writing, storing and reading a data block, error of data bit(s) may occur, and thus there is a need to check and correct the stored data block.

ECC (Error Correction Code) is often used to detect and correct data bit(s) in error in a data block. For example, when data are written into a memory, each data block is considered as a whole with a number of parity bits generated for it, and the resulting data (including data bits of the data block and the number of parity bits) are stored in the memory, wherein generating of each of the parity bits is defined by an ECC encoding rule used. A proper ECC encoding rule and the number of the parity bits can be selected based on the data length of the data block and the number of bit(s) requiring detection and correction.

ECC usually takes the form of linear codes, and for a compromise between error rate and repairing cost, the most common ECC is SEC/DED (single error correcting/double error detecting) codes among linear codes. In the case of SEC/DED codes being used, with a 64-bit data block (whose data length is 64 bits) taken for example, SEC/DED codes in (72, 64) format can be adopted, where 64 denotes the length of data bits, and 72 denotes the sum of the length of data bits and the length of parity bits, i.e., the number of the parity bits is 8.

An ECC memory is a memory that is widely used and has auto-correcting function, and is suitable to store a data block along with parity bits generated for it as described above. Storage arrays of an ECC memory are usually arranged based on the data length of data blocks that the ECC memory is intended to store and ECC (or an ECC encoding rule) that the ECC memory is intended to use. Once being formed, storage arrays of an ECC memory cannot be physically modified. Therefore, usually a single ECC memory is only used to store data blocks with a specific data length.

For instance, FIG. 1 schematically shows a storage array of an ECC memory for data blocks with a data length of 64 bits. In FIG. 1, SEC/DED codes in (72, 64) format are used, with 64 data bits of a data block denoted by d<63:0> and 8 parity bits generated for the data block denoted by p<7:0>. The storage array can be divided into two parts, a data bit storage part A for storing data bits d<63:0>, and a parity bit storage part B for storing parity bits p<7:0>. If the storage array is divided on the basis of storage cells, it can be divided into 9 storage cells, of which 8 storage cells A7~A0 are included by the data bit storage part A, and one storage cell is included by the parity bit storage part B, and each of the storage cells includes 8 storage bits, in which 8 bits can be stored.

When the system where the ECC memory is located operates in different modes, there may be a need to use data blocks with a different data length, for example, 32-bit data blocks. Then, for 32-bit data blocks, the ECC memory which adopts SEC/DED codes in (72, 64) format as mentioned above and is intended to store data blocks with a data length of 64 bits cannot be used in an efficient manner.

SUMMARY

One aspect of the invention features a method for storing data by an ECC memory. The method enables the ECC memory intended to be used for data blocks with a specific data length to be used for data blocks with a different data length in a relatively efficient manner.

The ECC memory comprises a storage array that includes a data bit storage part and a parity bit storage part. The data bit storage part is configured to store a data block with a first data length and includes a plurality of storage cells which have the same number of storage bits. The parity bit storage part is configured to store a first number of parity bits generated for the data block with the first data length according to an ECC encoding rule and includes a first number of storage bits.

The method includes writing a plurality of data blocks with a second data length into the memory, wherein according to the encoding rule, for each of the data blocks with the second data length, a second number of parity bits are generated for it, and if the second data length is less than the first data length: storing at least one data block with the second data length of the plurality of data blocks with the second data length in the data bit storage part in such a way that different data blocks of the at least one data block with the second data length occupy different storage cells of the data bit storage part, wherein the number of the at least one data block with the second data length is such that the total number of the storage cells occupied by the at least one data block is not greater than the number of the storage cells of the data bit storage part; and storing a second number of parity bits generated for only one data block of the at least one data block with the second data length according to the encoding rule in the parity bit storage part. When the at least one data block with the second data length is two or more data blocks, judgment bit(s), which indicate that the second number of parity bits stored in the parity bit storage part correspond to the only one data block, are stored in storage bit(s) not occupied of the parity bit storage part.

Another aspect of the invention features a method of storing data with different lengths by an ECC memory. The method includes determining whether a length of data to be stored is identical to a data length M of an storage array of the ECC memory or $\frac{1}{2^n}$ times of M, n being a natural number; and storing the data and at least one of corresponding parity bits or one or more position judgment bits in the ECC memory based on the determined result, the corresponding parity bits being used for performing ECC operation to verify whether the stored data is correct, the position judgment bits being for judging a storage position of the data bits to which the parity bits correspond in the storage array.

The method can include the following steps:

1) judging whether the length of data to be stored is the same as the data length M of an storage array of the ECC memory or is $\frac{1}{2^n}$ times of M, i.e., $\frac{1}{2^n}$ M, where n is a natural number, if the length of data to be stored is the same as M, going on to step 2, if the length of data to be stored is $\frac{1}{2^n}$ times of M, going on to step 3, and if the length of data to be stored is less than M bits but is not equal to $\frac{1}{2^n}$ times of M, going on to step 4;

2) the ECC memory being operated in a common manner for it: generating parity bits having a length k bits using M-bit data to be stored, and storing the parity bits and the M-bit data to be stored in the storage array;

3) storing $\frac{1}{2^n}$ M bits of data in a portion of the storage array, some of storage space for the intended parity bits having the length k bits being used for storing parity bits for the $\frac{1}{2^n}$ M bits of data, the remaining bit(s) of the storage space for the intended parity bits being position judgment bit(s) for this group of data, the parity bits being used for performing ECC operation to verify whether the stored data is correct, the position judgment bit(s) being for judging the storage position of the data bits to which the parity bits correspond in the storage array; the portion of the storage array not occupied by the $\frac{1}{2^n}$ M bits of data being still available for storing data bits, except that they have no corresponding parity bits;

4) storing data less than M bits in a portion of the storage array, some of storage space for the intended parity bits having the length k being used for storing parity bits for this data, the remaining bit(s) of the storage space for the intended parity bits being position judgment bit(s) for this group of data, the parity bits being used for performing ECC operation to verify whether the stored data is correct, the position judgment bit(s) being for judging the storage position of the data bits to which the parity bits correspond in the storage array; if the length of the data is less than M/2 bits, the portion of the storage array not occupied by this data being still available for continuing storing the same length of data bits, except that these data bits have no corresponding parity bits; if the length of the data is larger than M/2 bits, further storing being no longer possible.

Using the method of the present invention, it is possible to enable an ECC memory to be applicable to data blocks with different data lengths in a relatively efficient manner, without physically modifying storage arrays of the ECC memory (i.e., without changing storage arrays of the ECC memory), while it is still possible to perform ECC operation on, i.e., to check and correct, at least some of data blocks. The method of the invention makes use of characteristics of the ECC encoding rule to a certain degree.

Another aspect of the invention features a computer-readable storage medium coupled to one or more processors and having instructions stored thereon which, when executed by the one or more processors, cause the one or more processors to perform operations in accordance with implementations of the methods provided herein.

Other aspects of the invention feature a system for implementing the methods provided herein. The system includes one or more processors, and a computer-readable storage medium coupled to the one or more processors having instructions stored thereon which, when executed by the one or more processors, cause the one or more processors to perform operations in accordance with implementations of the methods provided herein.

Other advantages and advantageous embodiments of the subject-matter of the invention will be appreciated from the description, the claims and the drawings. The features mentioned above and those set out below may also be used individually per se or together in any combination. The embodiment shown and described is not intended to be understood to be a conclusive listing but is instead of exemplary character for describing the invention. The Figures of the drawings show the subject-matter in a schematic manner and are not intended to be understood to be to scale.

DETAILED DESCRIPTION

Figure 1:
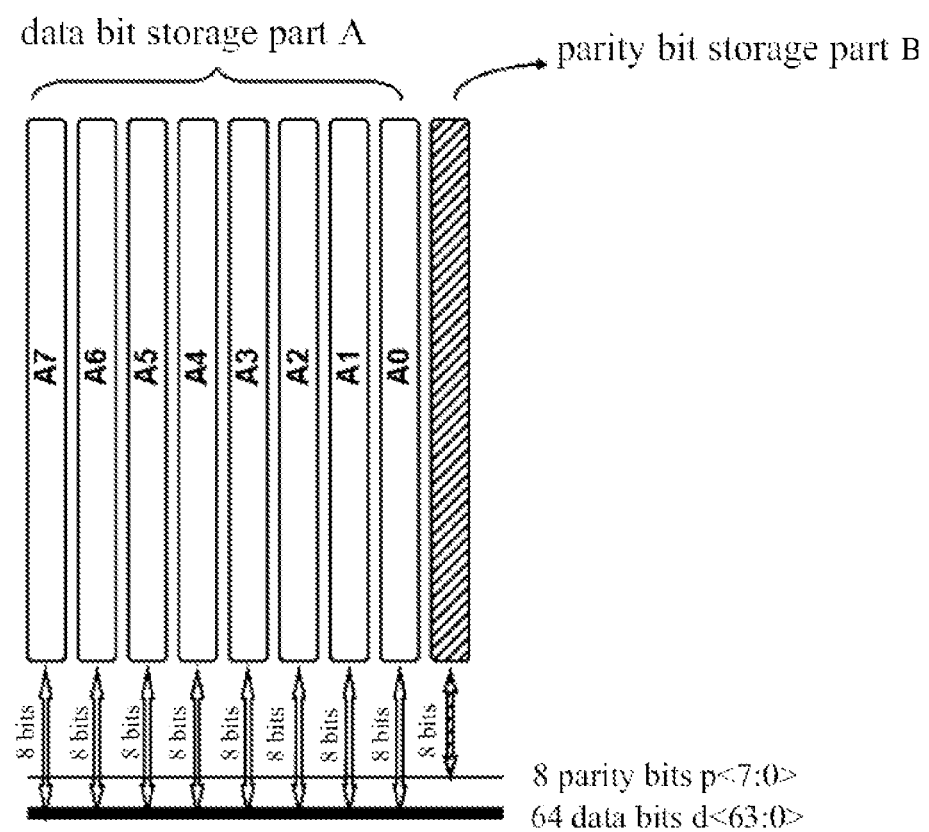
FIG. 1 is a schematic diagram exemplarily illustrating storing a data block and its corresponding parity bits in a storage array of an ECC memory.

Implementations of the present invention are generally directed to a method for an ECC memory, the memory comprising a storage array that includes a data bit storage part and a parity bit storage part, the data bit storage part being intended to store a data block with a first data length and including a plurality of storage cells which have the same number of storage bits, the parity bit storage part being intended to store a first number of parity bits generated for the data block with the first data length according to an ECC encoding rule and including a first number of storage bits.

The method comprises writing a plurality of data blocks with a second data length into the memory, wherein according to the encoding rule, for each of the data blocks with the second data length, a second number of parity bits are generated for it. If the second data length is less than the first data length, the method includes storing at least one data block with the second data length of the plurality of data blocks with the second data length in the data bit storage part in such a way that different data blocks of the at least one data block with the second data length occupy different storage cells of the data bit storage part, wherein the number of the at least one data block with the second data length is such that the total number of the storage cells occupied by the at least one data block is not greater than the number of the storage cells of the data bit storage part; and storing a second number of parity bits generated for only one data block of the at least one data block with the second data length according to the encoding rule in the parity bit storage part. When the at least one data block with the second data length is two or more data blocks, judgment bit(s), which indicates that the second number of parity bits stored in the parity bit storage part correspond to the only one data block, is stored in storage bit(s) not occupied of the parity bit storage part.

In some implementations, according to the encoding rule, if the data length of a data block is halved, the number of parity bits generated for it is reduced by at least 1.

In some implementations, the first data length is 4 bits, and the first number is 4 bits; or, the first data length is 8 bits, and the first number is 5 bits; or, the first data length is 16 bits, and the first number is 6 bits; or, the first data length is 32 bits, and the first number is 7 bits; or, the first data length is 64 bits, and the first number is 8 bits; or, the first data length is 128 bits, and the first number is 9 bits; or, the first data length is 256 bits, and the first number is 10 bits.

The first data length can be integral multiple of the second data length. In a particular example, the number of the at least one data block with the second data length is equal to the ratio of the first data length to the second data length.

In some implementations, the storage cell(s) occupied by each data block with the second data length is consecutive, and the judgment bit(s) indicates the relative position of the storage cell(s) occupied by the only one data block among the storage cells of the data bit storage part. In particular, the judgment bit(s) includes at least one bit which is 1 or 0, and constitute a binary number, whose value indicates the relative position of the storage cell(s) occupied by the only one data block among the storage cells of the data bit storage part in terms of address.

The value of the binary number and the addresses of the storage cells occupied by the only one data block among the storage cells of the data bit storage part can be related such that the larger the value of the binary number is, the higher the address(es) of the storage cell(s) occupied by the only one data block among the storage cells of the data bit storage part being is indicated, and the smaller the value of the binary number is, the lower the address(es) of the storage cell(s) occupied by the only one data block among the storage cells of the data bit storage part being is indicated; or the larger the value of the binary number is, the lower the address(es) of the storage cell(s) occupied by the only one data block among the storage cells of the data bit storage part being is indicated, and the smaller the value of the binary number is, the higher the address(es) of the storage cell(s) occupied by the only one data block among the storage cells of the data bit storage part being is indicated.

In some cases, the judgment bit(s) includes at least one bit which is 1 or 0, and the number of the at least one data block with the second data length is equal to the number of different potential values of the binary number constituted by the judgment bit(s). For example, on the assumption that the judgment bit(s) includes i bit(s), each of which is 1 or 0, where i is a positive integer greater than or equal to 1, the number of the at least one data block with the second data length is equal to $2^i$.

The method can further include, during reading any one data block of the at least one data block with the second data length from the memory, determining whether the second number of parity bits stored in the parity bit storage part correspond to the any one data block or not based on the judgment bit(s), and if the second number of parity bits stored in the parity bit storage part correspond to the any one data block, checking and correcting the any one data block using the second number of parity bits stored in the parity bit storage part.

The ECC memory can include an ECC circuit for checking and correcting the data block read. For example, the ECC circuit can have two input terminals, one of which is for receiving the data block read, and the other of which is for receiving parity bits to which the data block read corresponds, a logic part for checking and correcting the received data block using the received parity bits according to a predetermined rule, and an output terminal for outputting the corrected data block.

In some examples, only the data block to which the second number of parity bits stored in the parity bit storage part correspond is checked and corrected; for other block(s), if any, no checking or correcting is performed.

Parity bits generated for a data block according to the encoding rule can include linear ECC codes. In a preferable example, the ECC codes are SEC/DED codes.

Hereinafter, in combination with FIGS. 1 and 2, with an ECC memory intended to be used for data blocks with a 64-bit data length being used for data blocks with a 32-bit data length in the case of using SEC/DED codes taken for example, the method of the invention is explained by way of example.

In the case of SEC/DED codes being used, according to the corresponding ECC encoding rule, for a data block with a data length of 32 bits, 7 parity bits can be generated for it, i.e., SEC/DED codes in (39, 32) format can be used, where the length of data bits is 32 bits, and the number of parity bits is 7 bits.

Two 32-bit data blocks, which are denoted by d0<31:0> and d1<31:0> respectively, can be stored in the data bit storage part of the storage array. Correspondingly, the data bit storage part A in FIG. 1 can be divided into a data bit storage part A0 for storing d0<31:0> and a data bit storage part A1 for storing d1<31:0>. The data bit storage part A0 includes four consecutive storage cells A0_0~A0_3 which have the same number of storage bits, and the data bit storage part A1 ncludes another four consecutive storage cells A1_0~A1_3 which have the same number of storage bits, each of the storage cell having 8 storage bits.

7 parity bits generated for one data block of the above two data blocks can be stored in the parity bit storage part B, and the remaining 1 storage bit (i.e., the 1 storage bit not occupied) of the parity bit storage part B can be used to store a judgment bit.

For example, the lower 7 bits of the storage cell of the parity bit storage part can be used to store parity bits p<6:0>, and the highest bit of this storage cell can be used to store a judgment bit p<7> for judging whether the 7 parity bits correspond to 32 data bits of d0<31:0> or d1<31:0>. For example, it can be defined that, when the judgment bit p<7> is equal to 0, it is indicated that the 7 parity bits stored in the parity bit storage part B correspond to the data block stored in storage cells A0_0 ~A0_3 with lower addresses of the storage cells of the data bit storage part A, i.e., 32 data bits of d0<31:0>, and when the judgment bit p<7 > is equal to 1, it is indicated that the 7 parity bits stored in the parity bit storage part B correspond to the data block stored in storage cells A 1_0 ~A1_3 with higher addresses of the storage cells of the data bit storage part A, i.e., 32 data bits of d1<31:0>. It is also possible to define that, when the judgment bit p<7> is equal to 0, it is indicated that the 7 parity bits stored in the parity bit storage part B correspond to the data block stored in storage cells A1_0~A1_3 with higher addresses of the storage cells of the data bit storage part A, i.e., 32 data bits of d1<31:0>, and when the judgment bit p<7> is equal to 1, it is indicated that the 7 parity bits stored in the parity bit storage part B correspond to the data block stored in storage cells A0_0~A0_3 with lower addresses of the storage cells of the data bit storage part A, i.e., 32 data bits of d 0<31:0>.

For instance, when one data block for example d0<31:0> is written into the memory, 7 parity bits p<6:0> can be generated for it using the encoding rule, with d0<31:0> stored in the data bit storage part A0, and with the parity bits p<6:0> together with a judgment bit p<7> which is set to 0, for example, written into the parity bit storage part B; and, when d1<31:0> is written into the memory, it is directly stored in the data bit storage part A1 without parity bits being generated for it.

Correspondingly, when any one data block d0<31:0> or d1<31:0> is read from the memory, it is determined based on the judgment bit p<7> whether the parity bits stored in the parity bit storage part B correspond to this data block or not. And, if the parity bits stored in the parity bit storage part B correspond to this data block, this data block is checked and corrected using the parity bits stored in the parity bit storage part B; otherwise, this data block is not checked or corrected.

Figure 2:
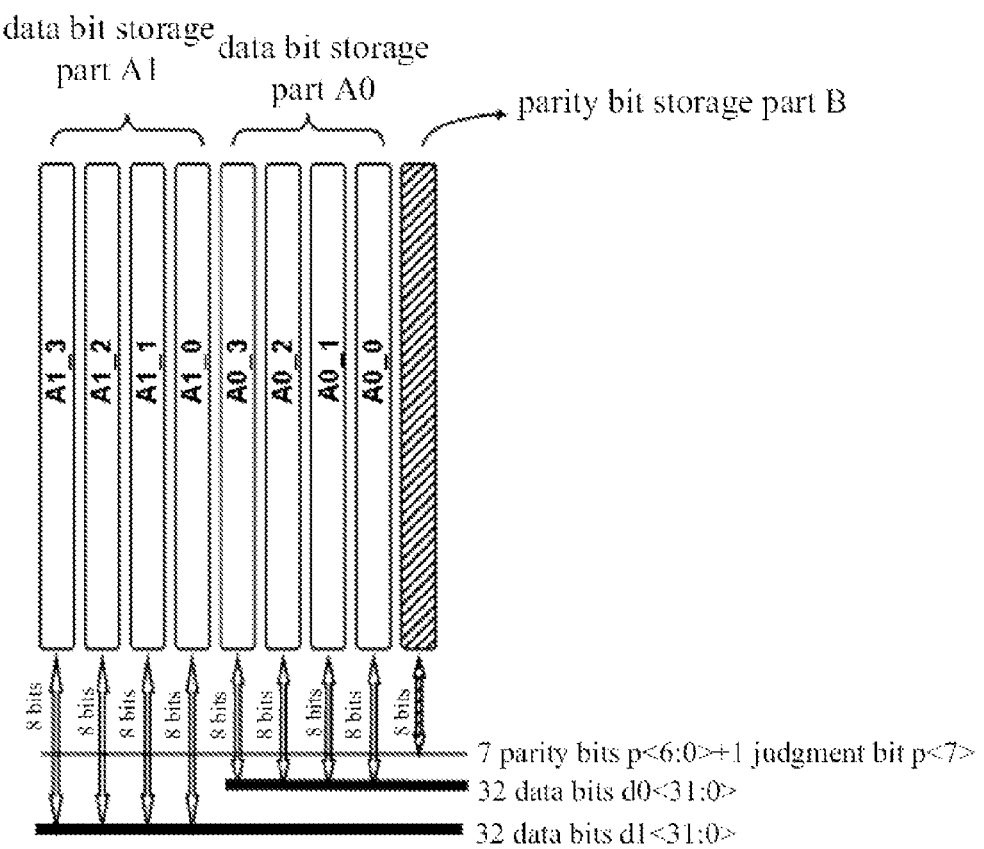
FIG. 2 is a schematic diagram exemplarily illustrating a method of using the storage array in FIG. 1 for data blocks with a different data length.

What is shown in FIG. 2 is merely exemplary. The method can be applicable to data blocks with other data lengths. For example, the ECC memory intended to be used for data blocks with a data length of 64 bits as shown in FIG. 2 can be used for data blocks with a data length of 16 bits.

In the case of SEC/DED codes being used, according to the corresponding encoding rule, for a data block with a data length of 16 bits, 6 parity bits can be generated for it, i.e., SEC/DED codes in (22, 16) format can be used, where the length of data bits is 16 bits, and the number of parity bits is 6 bits.

Four 16-bit data blocks can be stored in the data bit storage part of the storage array. Here, for the sake of depiction, d3<15:0>, d2<15:0>, d1<15:0> and d0<15:0> are used to denote the four data blocks respectively. Correspondingly, the data bit storage part A in FIG. 1 can be divided into four data bit storage parts for storing d3<15:0>, d2<15:0>, d1<15:0> and d0<15:0> respectively, each of which can include two consecutive storage cells having the same number of storage bits, each of the storage cells having 8 storage bits.

6 parity bits generated for one data block of the above four data blocks can be stored in the parity bit storage part B, and the remaining 2 storage bits (i.e., the 2 storage bits not occupied) of the parity bit storage part B can be used to store judgment bits. The two-bit judgment bits indicate which data block the parity bits stored in the parity bit storage part B correspond to, for example, by indicating which data bit storage part the data block is stored in.

For example, the lower 6 bits of the storage cell of the parity bit storage part can be used to store parity bits p<5:0>, and the higher 2 bits of this storage cell can be used to store judgment bits p<7:6> for judging which of d3<15:0>, d2<15:0>, d1<15:0> and d0<15:0> the 6 parity bits correspond to 16 data bits of. For example, it can be defined that, when the judgment bits p<7:6> are equal to 00, it is indicated that the 6 parity bits stored in the parity bit storage part B correspond to the data block stored in two storage cells with the lowest addresses of the storage cells of the data bit storage part A;

when the judgment bits p<7:6> are equal to 11, it is indicated that the 6 parity bits stored in the parity bit storage part B correspond to the data block stored in two storage cells with the highest addresses of the storage cells of the data bit storage part A;

when the judgment bits p<7:6> are equal to 01, it is indicated that the 6 parity bits stored in the parity bit storage part B correspond to the data block stored in two storage cells with sub-lower addresses of the storage cells of the data bit storage part A; and, when the judgment bits p<7:6> are equal to 10, it is indicated that the 6 parity bits stored in the parity bit storage part B correspond to the data block stored in two storage cells with sub-higher addresses of the storage cells of the data bit storage part A.

The value of the binary number constituted by the judgment bits can indicate the relative position of the storage cells occupied by the data block to which the 6 parity bits stored in the parity bit storage part B correspond among the storage cells of the data bit storage part A in terms of address, the larger the value of the binary number is, the higher the addresses of the storage cells occupied by this data block among the storage cells of the data bit storage part being indicated, and the smaller the value of the binary number is, the lower the addresses of the storage cells occupied by this data block among the storage cells of the data bit storage part being is indicated.

Besides, the method is applicable to ECC memories which are intended to store data blocks with various data lengths (for example 256 bits, 128 bits, 64 bits, 32 bits, 16 bits, 8 bits, 4 bits, etc.), including ECC memories known nowadays and ECC memories that will appear in the future. Using the method, it is possible to enable an ECC memory intended to be used for data blocks with a specific data length to be used for data which are suitable to be divided in length and accompanied with corresponding ECC codes (not limited to SEC/DED codes).

The method can depend on the following characteristic of the ECC encoding rule to a certain degree: according to the encoding rule, if the data length of a data block is halved, the number of parity bits generated for it is reduced by at least 1.

Although in the above exemplary description, the ECC memory is used to store data blocks with the following data length: this data length is $½^n$ times of the data length of data blocks that this memory is intended to store, where n is a natural number, this is not necessary. As long as the data length of data blocks to be stored is less than the data length of data blocks that the ECC memory is intended to store, the method can be advantageously employed.

A number of embodiments of the invention have been described. Nevertheless, it will be understood that various modifications may be made without departing from the spirit and scope of the invention. Accordingly, other embodiments are within the scope of the following claims.

What is claimed is:

1. A method of storing data by an ECC memory, the memory comprising a storage array that includes a data bit storage part and a parity bit storage part, the data bit storage part being configured to store a data block with a first data length and including a plurality of storage cells which have a same number of storage bits, the parity bit storage part being configured to store a first number of parity bits generated for the data block with the first data length according to an ECC encoding rule and including the first number of storage bits, the method comprising:

writing a plurality of data blocks with a second data length into the memory, wherein according to the encoding rule, for each of the data blocks with the second data length, a second number of parity bits are generated for it, wherein if the second data length is less than the first data length:

storing at least one data block with the second data length of the plurality of data blocks with the second data length in the data bit storage part, such that different data blocks of the at least one data block with the second data length occupy different storage cells of the data bit storage part, wherein a total number of one or more storage cells occupied by the at least one data block with the second data length is not greater than the number of the storage cells of the data bit storage part; and storing a second number of parity bits generated for only one data block of the at least one data block with the second data length according to the encoding rule in the parity bit storage part, wherein, when the at least one data block with the second data length includes two or more data blocks, one or more judgment bits configured to indicate that the second number of parity bits stored in the parity bit storage part correspond to the only one data block are stored in one or more storage bits of the parity bit storage part that are not occupied.

2. The method of claim 1, wherein, according to the encoding rule, if the data length of a data block is halved, the number of parity bits generated for it is reduced by at least 1.

3. The method of claim 1, wherein the encoding rule is configured such that the first data length and the first number satisfy one of the first data length is 4 bits and the first number is 4 bits,
the first data length is 8 bits and the first number is 5 bits,
the first data length is 16 bits and the first number is 6 bits,
the first data length is 32 bits and the first number is 7 bits,
the first data length is 64 bits and the first number is 8 bits,
the first data length is 128 bits and the first number is 9 bits, and
the first data length is 256 bits and the first number is 10 bits.

4. The method of claim 1, wherein the first data length is an integral multiple of the second data length.

5. The method of claim 4, wherein the number of the at least one data block with the second data length is equal to a ratio of the first data length to the second data length.

6. The method of claim 1, wherein the storage cells occupied by each data block with the second data length are consecutive,
wherein the judgment bits include at least one bit which is 1 or 0 and constitute a binary number whose value indicates a relative position of the storage cells occupied by the only one data block among the storage cells of the data bit storage part in terms of address, and
wherein the value of the binary number and the addresses of the storage cells occupied by the only one data block among the storage cells of the data bit storage part are related such that
the larger the value of the binary number is, the higher the addresses of the storage cells occupied by the only one data block among the storage cells of the data bit storage part being is indicated, and the smaller the value of the binary number is, the lower the addresses of the storage cells occupied by the only one data block among the storage cells of the data bit storage part being is indicated, or
the larger the value of the binary number is, the lower the addresses of the storage cells occupied by the only one data block among the storage cells of the data bit storage part being is indicated, and the smaller the value of the binary number is, the higher the addresses of the storage cells occupied by the only one data block among the storage cells of the data bit storage part being is indicated.

7. The method of claim 1, wherein the one or more judgment bits include i bits, each of which is 1 or 0, and wherein i is a positive integer greater than or equal to 1 and the number of the at least one data block with the second data length is equal to $2^i$.

8. The method of claim 1, further comprising, during reading any one data block of the at least one data block with the second data length from the memory,
determining, based on the judgment bits, whether the second number of parity bits stored in the parity bit storage part correspond to the any one data block; and
if it is determined that the second number of parity bits stored in the parity bit storage part correspond to the any one data block, checking and correcting the any one data block using the second number of parity bits stored in the parity bit storage part.

9. The method of claim 1, wherein parity bits generated for a data block according to the encoding rule comprise linear ECC codes.

10. The method of claim 9, wherein the ECC codes comprise SEC/DED codes.

11. A method of storing data with different lengths by an ECC memory, the method comprising:
determining whether a length of data to be stored is identical to a data length M of an storage array of the ECC memory or $\frac{1}{2}^n$ times of M, n being a natural number; and
storing the data and at least one of corresponding parity bits or one or more position judgment bits in the ECC memory based on the determined result, the corresponding parity bits being used for performing ECC operation to verify whether the stored data is correct, the position judgment bits being for judging a storage position of the data bits to which the parity bits correspond in the storage array.

12. The method of claim 11, wherein the determining comprises determining that the length of data to be stored is the same as the data length M, and
wherein the storing comprises:
generating corresponding parity bits having a length of k bits using the M-bit data to be stored; and
storing the corresponding parity bits and the M-bit data to be stored in the storage array.

13. The method of claim 11, wherein the determining comprises determining that the length of data to be stored is $\frac{1}{2}^n$ times of M, and
wherein the storing comprises:
storing $\frac{1}{2}^n$ M bits of data in a portion of the storage array; and
storing the corresponding parity bits having a length less than k bits for the $\frac{1}{2}^n$ M bits of data in a storage space of the storage array configured to be used for storing k parity bits that would be generated for M-bit data, wherein one or more remaining bits of the storage space are the position judgment bits for the $\frac{1}{2}^n$ M bits of data, and wherein a portion of the storage array not occupied by the $\frac{1}{2}^n$ M bits of data is available for storing data having no corresponding parity bits.

14. The method of claim 11, wherein the determining comprises determining that the length of data to be stored is less than M bits but is not equal to $\frac{1}{2}^n$ times of M, and
wherein the storing comprises:
storing data bits having the length less than M bits in a portion of the storage array; and
storing the corresponding parity bits having a length less than k bits for the data bits having the length less than M bits in a storage space of the storage array configured to be used for storing k parity bits that would be generated for M-bit data, wherein one or more remaining bits of the storage space are the position judgment bits for the data bits having the length less than M bits, and
wherein the storing further comprises:
if it is determined that the length of the data to be stored is less than M/2 bits, continuing storing, in the portion of the storage array not occupied, the same length of data bits which have no corresponding parity bits; and
if it is determined that the length of the data to be stored is larger than M/2 bits, stopping storing data bits.

15. The method of claim 11, wherein the data length of the storage array of the ECC memory is 8 bits, 16 bits, 32 bits, 64 bits, 128 bits, or 256 bits, and the corresponding parity bits are 4 bits, 5 bits, 6 bits, 7 bits, 8 bits, 9 bits, or 10 bits, respectively.

16. A system comprising:
one or more processors; and
a computer-readable storage medium coupled to the one or more processors having instructions stored thereon which, when executed by the one or more processors, cause the one or more processors to perform operations for storing data by an ECC memory, the memory comprising a storage array that includes a data bit storage part and a parity bit storage part, the data bit storage part being configured to store a data block with a first data length and including a plurality of storage cells which have a same number of storage bits, the parity bit storage part being configured to store a first number of parity bits generated for the data block with the first data length according to an ECC encoding rule and including the first number of storage bits, the operations comprising:

writing a plurality of data blocks with a second data length into the memory, wherein according to the encoding rule, for each of the data blocks with the second data length, a second number of parity bits are generated for it, wherein if the second data length is less than the first data length:

storing at least one data block with the second data length of the plurality of data blocks with the second data length in the data bit storage part, such that different data blocks of the at least one data block with the second data length occupy different storage cells of the data bit storage part, wherein a total number of one or more storage cells occupied by the at least one data block with the second data length is not greater than the number of the storage cells of the data bit storage part; and storing a second number of parity bits generated for only one data block of the at least one data block with the second data length in the parity bit storage part, wherein, when the at least one data block with the second data length includes two or more data blocks, one or more judgment bits configured to indicate that the second number of parity bits stored in the parity bit storage part correspond to the only one data block are stored in one or more storage bits of the parity bit storage part that are not occupied.

17. The system of claim 16, wherein, according to the encoding rule, if the data length of a data block is halved, the number of parity bits generated for it is reduced by at least 1.

18. The system of claim 16, wherein the storage cells occupied by each data block with the second data length are consecutive, wherein the judgment bits include at least one bit which is 1 or 0 and constitute a binary number whose value indicates a relative position of the storage cells occupied by the only one data block among the storage cells of the data bit storage part in terms of address, and wherein the value of the binary number and the addresses of the storage cells occupied by the only one data block among the storage cells of the data bit storage part are related such that the larger the value of the binary number is, the higher the addresses of the storage cells occupied by the only one data block among the storage cells of the data bit storage part being is indicated, and the smaller the value of the binary number is, the lower the addresses of the storage cells occupied by the only one data block among the storage cells of the data bit storage part being is indicated, or the larger the value of the binary number is, the lower the addresses of the storage cells occupied by the only one data block among the storage cells of the data bit storage part being is indicated, and the smaller the value of the binary number is, the higher the addresses of the storage cells occupied by the only one data block among the storage cells of the data bit storage part being is indicated.

19. The system of claim 16, wherein the first data length is an integral multiple of the second data length, and wherein the number of the at least one data block with the second data length is equal to a ratio of the first data length to the second data length.

20. The system of claim 16, wherein the one or more judgment bits include i bits, each of which is 1 or 0, and wherein i is a positive integer greater than or equal to 1 and the number of the at least one data block with the second data length is equal to $2^i$.

21. The system of claim 16, wherein the operations further comprise, during reading any one data block of the at least one data block with the second data length from the memory, determining, based on the judgment bits, whether the second number of parity bits stored in the parity bit storage part correspond to the any one data block; and in response to determining that the second number of parity bits stored in the parity bit storage part correspond to the any one data block, checking and correcting the any one data block using the second number of parity bits stored in the parity bit storage part.

22. A non-transitory computer-readable storage medium coupled to one or more processors and having instructions stored thereon which, when executed by the one or more processors, cause the one or more processors to perform operations for storing data by an ECC memory, the memory comprising a storage array that includes a data bit storage part and a parity bit storage part, the data bit storage part being configured to store a data block with a first data length and including a plurality of storage cells which have a same number of storage bits, the parity bit storage part being configured to store a first number of parity bits generated for the data block with the first data length according to an ECC encoding rule and including the first number of storage bits, the operations comprising:

writing a plurality of data blocks with a second data length into the memory, wherein according to the encoding rule, for each of the data blocks with the second data length, a second number of parity bits are generated for it, wherein if the second data length is less than the first data length:

storing at least one data block with the second data length of the plurality of data blocks with the second data length in the data bit storage part, such that different data blocks of the at least one data block with the second data length occupy different storage cells of the data bit storage part, wherein a total number of one or more storage cells occupied by the at least one data block with the second data length is not greater than the number of the storage cells of the data bit storage part; and storing a second number of parity bits generated for only one data block of the at least one data block with the second data length in the parity bit storage part, wherein, when the at least one data block with the second data length includes two or more data blocks, one or more judgment bits configured to indicate that the second number of parity bits stored in the parity bit storage part correspond to the only one data block are stored in one or more storage bits of the parity bit storage part that are not occupied.

23. The non-transitory computer-readable storage medium of claim 22, wherein, according to the encoding rule, if the data length of a data block is halved, the number of parity bits generated for it is reduced by at least 1.25.

\* \* \* \* \*